United States Patent [19]

Fasano et al.

[11] Patent Number: 5,340,617
[45] Date of Patent: Aug. 23, 1994

[54] ELECTROSTATIC PATTERNING OF MULTI-LAYER MODULE LAMINA

[75] Inventors: Benjamin V. Fasano, New Windsor, N.Y.; Vlad J. Novotny, Cupertino; Lawrence B. Schein, San Jose, both of Calif.

[73] Assignee: International Business Machines Corporation, Armonk, N.Y.

[21] Appl. No.: 931,748

[22] Filed: Aug. 18, 1992

[51] Int. Cl.$^5$ .............................................. B05D 3/14
[52] U.S. Cl. ..................................... 427/466; 427/96; 427/474; 118/644; 118/662
[58] Field of Search ................. 427/96, 466, 467, 472, 427/474, 475, 430.1, 485; 118/624, 625, 644, 653, 659, 662; 346/153.1; 106/20 B

[56] References Cited

U.S. PATENT DOCUMENTS

| | | |
|---|---|---|
| 2,097,233 | 10/1937 | Meston . |
| 2,293,887 | 8/1942 | Chamberlain . |
| 3,108,894 | 10/1963 | Stowell ................... 427/474 |
| 3,330,252 | 7/1967 | Oberg . |
| 3,643,628 | 2/1972 | Sugarman et al. ................. 118/662 |
| 3,656,173 | 4/1972 | Fussel ................. 346/153.1 |
| 3,689,933 | 9/1972 | Klose ................. 346/154 |
| 3,804,660 | 4/1974 | Metcalfe et al. ................. 430/31 |
| 3,876,448 | 4/1975 | Savit et al. ................. 430/118 |
| 3,925,074 | 12/1975 | Wuhof ................. 430/69 |
| 3,928,668 | 12/1975 | Snow . |
| 3,997,343 | 12/1976 | Weigl et al. ................. 430/67 |
| 4,138,351 | 2/1979 | Gilliams et al. ................. 430/115 |
| 4,139,653 | 2/1979 | Cassiers et al. ................. 430/97 |
| 4,202,913 | 5/1980 | Klavan et al. ................. 430/106 |
| 4,213,872 | 7/1980 | Cooper ................. 430/114 |
| 4,241,159 | 12/1980 | Priem et al. ................. 430/114 |
| 4,308,553 | 12/1981 | Roetling ................. 358/507 |
| 4,706,605 | 11/1987 | Bibl et al. ................. 118/630 |
| 4,711,832 | 12/1987 | Gruenbaum et al. ................. 430/106 |
| 4,886,730 | 12/1989 | Ota et al. ................. 430/137 |
| 4,900,647 | 2/1990 | Hikake et al. ................. 430/138 |
| 4,905,026 | 2/1990 | Day ................. 346/155 |
| 4,944,959 | 7/1990 | Yagi et al. . |
| 5,176,974 | 1/1993 | Till et al. ................. 430/42 |

FOREIGN PATENT DOCUMENTS

| | | | |
|---|---|---|---|
| 697138 | 11/1964 | Canada ................. | 118/653 |
| 49-4057 | 1/1974 | Japan ................. | 427/96 |
| 829198 | 5/1981 | U.S.S.R. ................. | 118/624 |
| 987847 | 3/1965 | United Kingdom ................. | 118/622 |

OTHER PUBLICATIONS

IBM Technical Disclosure, vol. 21, No. 11; Apr. 1979; "Electrostatic Holding Fixture for Flatness of a Nonrigid Sheet in Vacuum"; A. J. Juras et al.; p. 4505.

*Primary Examiner*—Terry J. Owens
*Attorney, Agent, or Firm*—Whitham, Curtis & Whitham

[57] ABSTRACT

Conductive patterns are formed on a surface and via connections through a lamina or substrate are formed by directly writing an electrostatic charge pattern on a surface of the lamina and developing the written pattern by application of conductive particles thereto, preferably in a liquid suspension of particulate material including a binder and/or a charge control agent. High resolution patterns are obtained with conductive powders having particle sizes in the range of 0.5 to 2.5 microns. Vias are formed by developing the charged pattern with conductive bodies such as spheres having a dimension similar to the finished thickness of the lamina or substrate. After development, the conductive bodies may be embedded within the lamina or substrate, possibly facilitated through the use of heat and lamination techniques. Insulative particulate material may also be used to form insulating patterns. A sequence of direct electrostatic writing and development operations enable the production of microstructures such as capacitors and multiple wiring layers on a single lamina or substrate.

16 Claims, 3 Drawing Sheets

ELECTROSTATIC PATTERNING OF MULTI-LAYER MODULE LAMINA

BACKGROUND OF THE INVENTION

1. Field of the Invention

The present invention generally relates to the formation of electrically conductive patterns on surfaces and, more particularly, to the formation of conductive patterns and via connections on and through lamina of multi-layer electronic devices.

2. Description of the Prior Art

The use of electrically conductive patterns on insulating substrates has been in widespread use in the construction of electrical and electronic devices for many years. Printed circuit boards and integrated circuit devices are exemplary of such conductor structures and indicate the wide range of sizes at which such conductive patterns can be formed. More recently, so-called multi-layer module (MLM) constructions, including multi-layer ceramic (MLC) modules have been used to provide a large number of interconnections between a plurality of chips contained in a single module. This type of construction is particularly advantageous since it allows many chips, possibly fabricated with mutually incompatible technologies, to be used together in a single electronic component. Circuits of much higher complexity can also be provided than could be integrated on a single chip at acceptable manufacturing yields.

Multi-layer modules are characterized by including a plurality of layers with conductive patterns formed thereon. These layers are generally divided into functional groups for providing power to each chip included therein, providing signal interconnections, shielding and forming connections to the individual chips. This latter group of layers, commonly referred to as distribution wiring, requires particularly fine patterning of conductors. Connections between layers are formed by placing conductive material in "through holes" formed in the insulating layers. Such completed structures are commonly referred to as vias.

The trend toward increasing integration density in integrated circuits has also been followed in multi-layer modules, requiring finer patterns of conductors, particularly in layers of distribution wiring which interface directly with chip terminals. Finer wiring patterns also implies that via patterns must also be formed at reduced size. Increased registration accuracy from layer to layer is also generally required since increasing via density without a scaled reduction in via diameter results in removal of a higher fraction of the lamina material which can make the layer extremely fragile.

Formation of conductive patterns has been done in the past by any one of several methods including the screening of conductive paste through a mask, ink jet writing, decal metallurgy transfer, and electron and laser patterning, each of which has severe limitations. Short usable lifetime of masks for screening or spraying operations increase costs and the minimum feature size available from such masks is limited. Materials which can be sprayed or screened also necessarily include some volatile solvents which must be removed by drying or baking to stabilize the pattern before the layers can be laminated together to form an MLM or MLC structure. Ink jet writing is slow and also limited as to minimum feature size. Decal metallurgy transfer is a complicated multi-step process requiring lithography steps and high registration accuracy. Electron/laser patterning requires substantial instrumentation and complex and expensive equipment. Ideally, photolithography is capable of producing highly conductive patterns of such metals as copper, gold, molybdenum, tungsten, etc. but is also a multi-step process which requires highly reactive etchants which are incompatible with the preferred materials for the insulating lamina of MLM devices.

Electrostatic formation of patterns has also been known and is the basic principle of the electrophotographic process. The same principles are used in virtually all commercially available copiers and laser printers at the present time. In this process, a photoconductor is exposed to an image which is then developed with toner. The toner is then transferred to a substrate such as paper. Typically the toner is a dry, pulverent and non-conductive material. Resolution of about five lines/mm is typically obtained. However, it is known that finer resolution is available from the use of liquid toners. However, the toner used, whether in the form of a liquid or dry powder is non-conductive.

At small pattern feature sizes, registration of layers is also complicated by the materials preferred for the insulating layers of MLM structures and MLC structures, in particular. In MLC structures, the layers are formed of uncured ceramic materials which are referred to as green sheets. These green sheets, at the time of patterning and/or via formation also contain volatile materials which cause slight shrinkage when they are driven off during lamination of the MLC device.

A recent technique of via formation involves the pressing of conductive metal spheres or rods into the green sheet to form vias. However, this requires some means to locate the conductive spheres at the points on the green sheet where vias are to be formed. This is typically done with a sheet including indentations or perforations into which the spheres can be distributed. However, the use of such a structure is unreliable since there is no mechanism for assuring that a sphere will, in fact, be positioned at every desired via location at the time of a pressing operation to embed the spheres in the green sheet. Further, a separate custom sheet must be made for each different via pattern desired, causing substantial expense in a process of limited reliability and manufacturing yield.

It should also be observed that the currently most reliable and preferred methods of forming conductive surface patterns and via patterns require significant amounts of expensive tooling and are therefore generally too expensive for the fabrication of custom MLM or MLC components. Therefore, as a practical matter, the cost of such tooling must be amortized over a large number of identical devices and designs may not be easily altered without the provision of special structures requiring significant space within the module. Conversely, the MLM technology is not realistically available for the construction of custom circuit components.

SUMMARY OF THE INVENTION

It is therefore an object of the present invention to provide a technique including both method and means for forming electrically conductive patterns on a surface of reduced minimum feature size and increased resolution and via patterns with increased yield and reduced cost.

It is another object of the present invention to provide for formation of custom via and surface patterns for lamina of MLM components at high manufacturing yields without custom tooling.

In order to accomplish these and other objects of the invention, a method of applying conductive material to a surface is provided including the steps of directly writing an electrostatic pattern on the surface, applying a particulate material to the surface, and adhering the particulate material to the surface.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
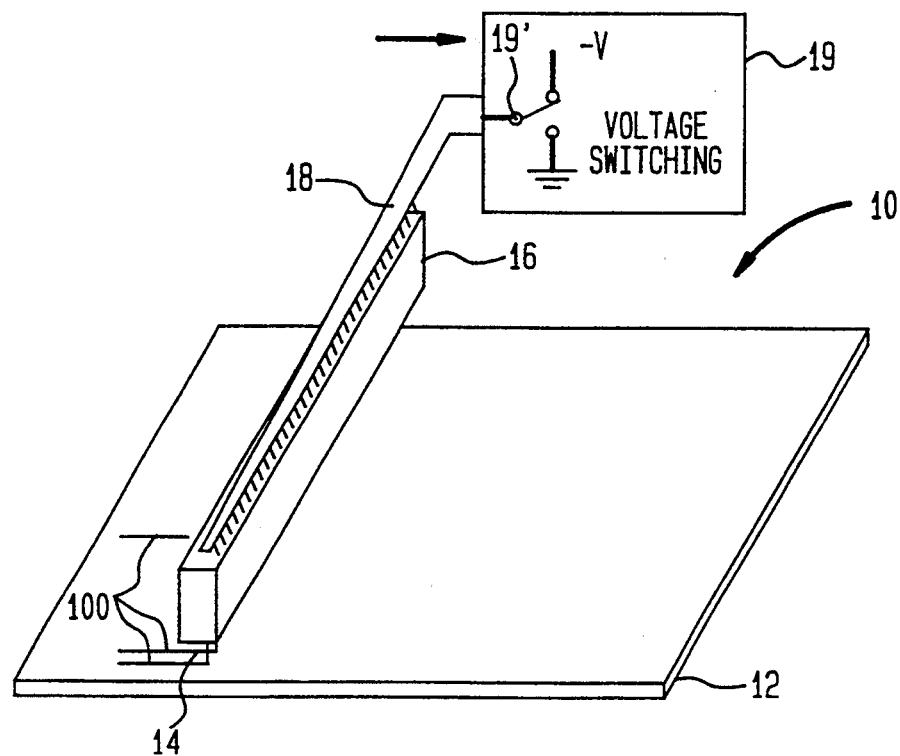
FIG. 1 is a schematic representation of one technique of direct writing of vias and conductive patterns on a green sheet.

Referring now to the drawings, and more particularly to FIG. 1, there is shown an arrangement 10 for direct writing of an electrostatic pattern on a green sheet. Ceramic green sheets currently used in MLC devices include a polyvinyl butyral binder which has an extremely high resistivity. The inventors have discovered and experimentally verified that an electrostatic charge can be placed on a region of the green sheet and maintained for a time sufficient for attraction of oppositely charged particles. Specifically, direct writing of an electrostatic charge on a green sheet has been accomplished with a fine metal wire connected to controllable voltages between 0 and −1200 volts. Using a fine wire for the writing of electrostatic patterns, it has been found that good patterns could be formed at −300 volts with density (e.g. vertical thickness of the pattern) increasing, upon development, as will be discussed below, to about −800 volts. Further charging beyond about −800 volts was found to cause some spreading of the pattern written. Reversed polarities of similar magnitudes could also be used (i.e. a positive electrostatic pattern with negatively charged particles).

Accordingly, the apparatus of FIG. 1 preferably includes a yoke 16 supporting a plurality of fine wires 14 and which can be moved relative to a green sheet, as indicated by the arrow in FIG. 1. Yoke 16 should be positioned so that wires 14 lightly touch the surface of green sheet 12. The distance to which wires 14 protrude from yoke 16 should be sufficient to allow slight flexure against the green sheet to accommodate irregularity in the thickness or height of the surface of the green sheet. However, the length of the wires should also be limited and the spacing between the wires sufficient to avoid flexure in the direction of the length of the yoke due to differences in voltage thereon. It is also preferred that some degree of relative movement, greater than the distance between wires 14 and orthogonal to the indicated direction be possible in order to assure pattern continuity regardless of conductor path.

Connections 18 to individual wires are also preferably supported by yoke 16. Charging voltages are selectively applied to connections 18 by a voltage switching circuit 19 in synchronism with relative movement between the yoke and green sheet and in accordance with a predetermined pattern to be written. The voltage switching circuit should also be capable of selectively delivering a voltage, −V, between −300 and −800 volts or a good ground connection (or slightly positive voltage since it has been found that faint images can be triboelectrically written by frictionally developed currents due to the contact of wires 14 and green sheet 12) as shown by the exemplary switch connection 19' illustrated. The particular structure of this switch connection is not considered to be critical to the practice of the invention. Thus, by using a plurality of wires many pattern portions 100 can be concurrently written at high speed.

As a variation of the arrangement of FIG. 1, the entire green sheet surface could be charged by a corona discharge and then selectively discharged by wires 14 which are selectively connectable to ground. A photoconductive sheet process could also be used to discharge the surface in the same manner.

Figure 2:
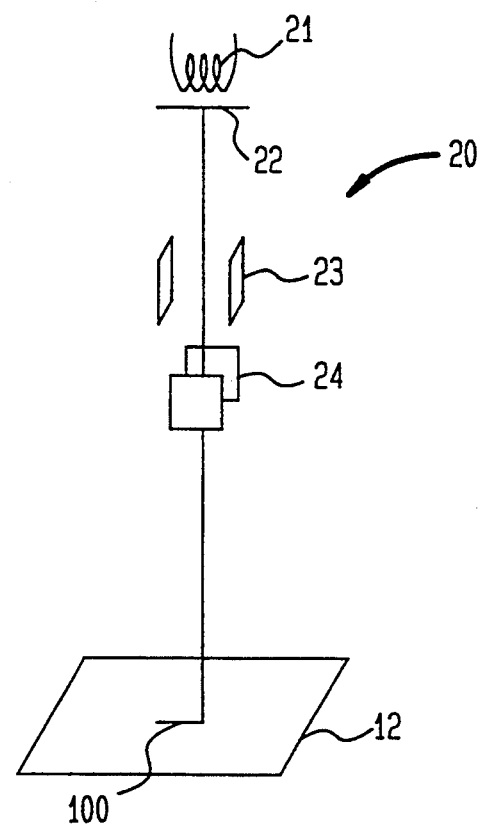
FIG. 2 is a schematic representation of another technique of direct writing of vias and conductive patterns on a green sheet, FIGS. 3 and 3a schematically illustrate alternative development arrangements for a directly written image on the green sheet.

Alternatively, as shown in FIG. 2, the writing of an electrostatic pattern on a green sheet can also be done with a deflectable electron beam apparatus 20. Filament 21 and aperture 22 from an electron beam source which can then be deflected by any type of charged particle deflection arrangement, schematically depicted by deflection plate pairs 23 and 24 in order to write pattern 100, as desired. In this case, the amount of charge could be controlled by writing speed or beam current or both. A plurality of beams, each of which can be selectively blanked, in an array possibly similar to the array formed by wires 14 in yoke 16, could also be used to enhance process speed.

Figure 3:
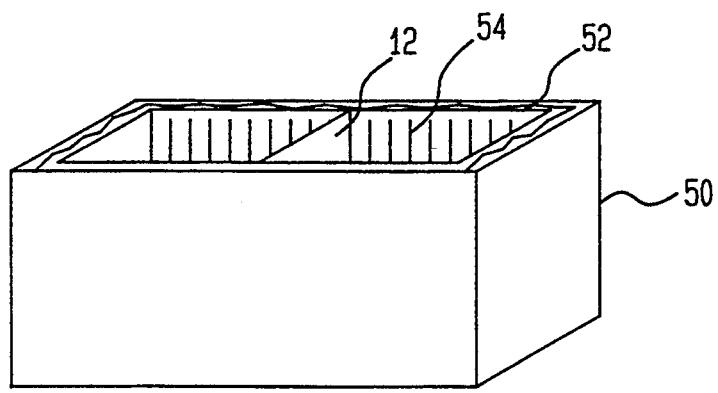

After the writing of an electrostatic charge pattern on the green sheet, the image is developed in the manner illustrated in FIG. 3. The developing agent is preferably a suspension of a fine copper powder in a non-conductive liquid. The non-conductive liquid must not affect the dimensional stability of the green sheet or substrate. For example, materials which are solvents for the substrate or green sheet binder would be inappropriate to the practice of the invention. Otherwise the non-conductive liquid is not particularly critical to the practice of the invention. The copper particle size should preferably be below 2.5 microns with an average particle size of about 1.5 microns. In general, finer lines require smaller particle sizes. The suspension stability can be improved and dispersion of particles down to the primary size can be achieved by addition of steric stabilizer to the suspension. The preferred stabilizers are block copolymers with one block adsorbing strongly on the particles and the second block residing in solution. A binder which is preferably hydrocarbon or acrylic based may be added to the liquid to enhance adhesion of the particles to the green sheets. Separate stabilizer and binder can be used or a material which has a dual function of binder and stabilizer can be employed.

Charge control agents such as napthanate, octoate, stearate and sulfonate compounds may also be added to the liquid to adjust the charge-to-mass ratio of the colloidal particles, control pattern density and thickness of the developed pattern. Particles are charged due to the potential chemical differences between the particle surface and the liquid. Additional particle charge can be achieved with charge control agents. These agents ionize in solution and at the solid-liquid interface, a preferential desorption or adsorption of ions of one polarity leads to additional or controllable charge on the particles.

Mechanically, the green sheets are preferably handled much in the same manner as sheet film during development, which takes only a few seconds due to the strong electrostatic attraction of the copper particles to the charged areas of the green sheet. Preferably, the developing suspension is held in a tank 50 of a size to receive a developing carrier or basket 52 therein. The green sheets are kept separated during development by ribs 54 which engage the green sheets. The developing basket 52 also preferably has apertures in the bottom and side walls thereof which allow entry and exit of the developing suspension without causing turbulence or liquid current velocities which would cause significant dislodging of the copper particles once they had attached to the green sheets.

Figure 3A:
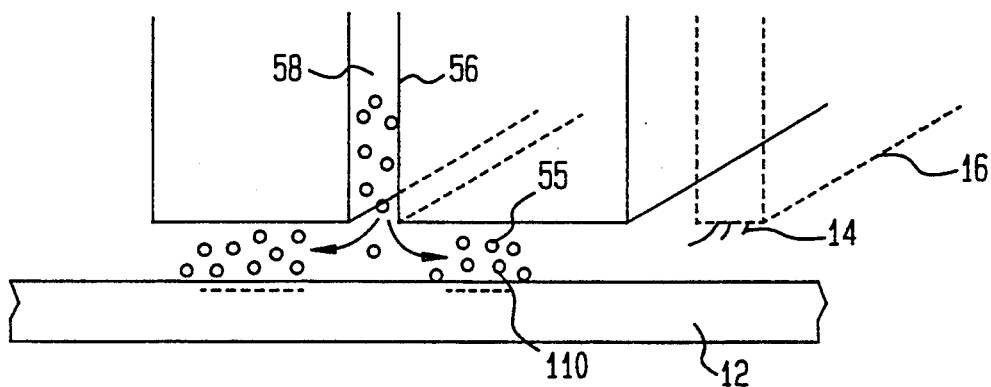

An alternate development system is shown in FIG. 3a which brings a flowing liquid dispersion 58 of particles 55 into contact with substrate 12 electrostatically charged along directly written patterns 100 which is relatively movable with reference to development slit 56. The particles 55 are thus deposited along patterns 110 in much the same fashion as in development tank 50 of FIG. 3. In connection with the writing apparatus 10 of FIG. 1 (illustrated in phantom in FIG. 3a), this development slit or station can follow directly behind the writing wires 14 and thus minimize delay between charging and developing during which some charge could be lost. The alternative development arrangement of FIG. 3a thus allows direct writing to be done at lower potentials and without pattern spreading.

Figure 4A:
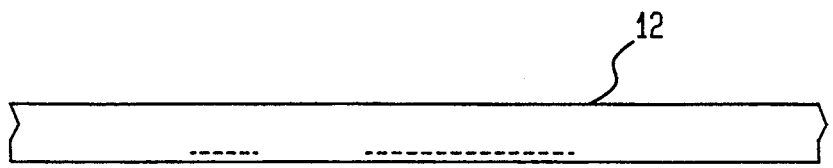
FIGS. 4a, 4b and 4c show a cross section of the green sheet after writing, after development and fusing, respectively of the conductive pattern formed in accordance with FIG. 3 or 3a, FIG. 5 illustrates application of the invention to the formation of via patterns.
Figure 4B:
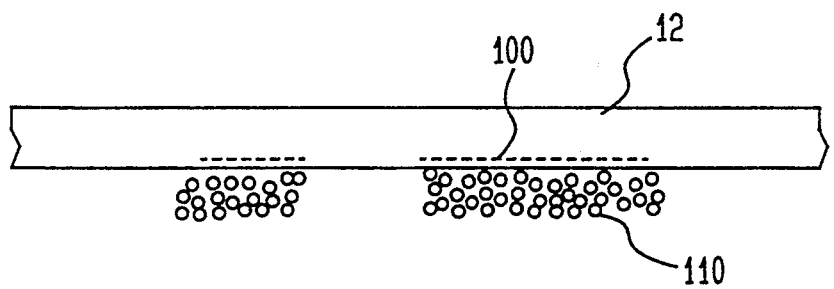
Figure 4C:
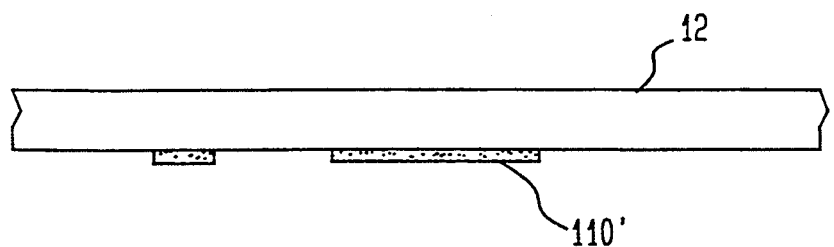

The direct electrostatic writing and development described above results in reliable conductive patterns 110, 110' corresponding to the directly written electrostatic pattern 100 on the surface of green sheets 12, as shown in cross-section in FIGS. 4a, 4b and 4c. In FIG. 4a, the directly written pattern 100 is shown. In FIG. 4b, the deposits 110 of particles 55 follow the directly written charge patterns 110. If desired or found necessary in view of the material of the particles 55, the integrity of the patterns can be improved by pressing, laminating or fusing of the particles as shown in FIG. 4c. These conductive patterns can be of much reduced line width and increased pitch in comparison with patterns formed by presently known methods. Specifically, line widths as fine as five microns have been achieved which corresponds to a resolution of 100 lines/mm. These line widths and resolutions substantially exceed the requirements of any current design for MLM components. Further, this high resolution provided by the invention can be exploited for high accuracy optical alignment of the green sheets for lamination in order to obtain accurate registration of the vias. Additionally, the technique of the invention can be used to form small electrostatic charge domains which are of assistance in maintaining the layers together and in registration prior to and during the lamination process. It should also be noted that green sheets as currently manufactured have a "shiny" side formed by the surface against which they are cast and a "dull" side from which volatile materials are evaporated. It has been found that somewhat smaller pattern feature sizes and higher resolutions can be achieved by practicing the invention on the "shiny" side of the green sheet.

Figure 5:
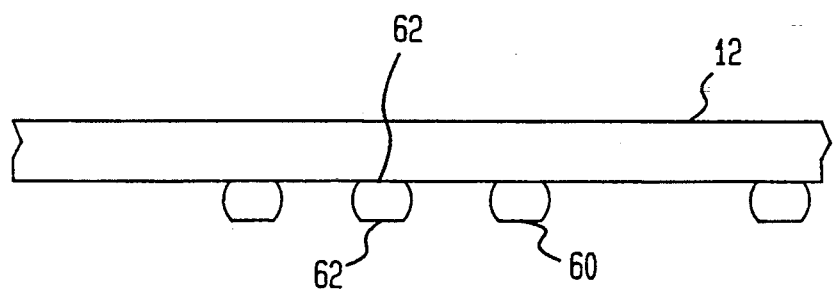

The above-noted preferred size of copper powder particles is chosen to provide good development properties and resultant low resistance of connections at small feature sizes. However, the practice of the invention is not so limited and larger or smaller particles could be used to form the patterns. Alternatively, other conductive materials such as gold, aluminum, tungsten, molybdenum and the like can also be used. As a particular variation of the invention, relatively large metal spheres can be used for forming via patterns as shown in FIG. 5. In this case, the electrostatic pattern is written as a pattern of small spots on the surface of green sheet 12. Development is done in the same manner as discussed in regard to FIG. 3 or merely by mechanically transporting spheres 60 (preferably charged with an opposite polarity to the charge pattern written on the green sheet) into proximity with the surface and charged locations thereon. This is preferably done with a relatively low pressure air stream. The charge pattern on the green sheet will then cause precise location of the spheres for subsequent pressing into the green sheet. It should be noted in this regard that in addition to the charge control agents, stabilizers and binders and other materials referred to above which may be used to stabilize the image, it is preferable that the conductive spheres be formed with a plurality of "flats" 62 which will further improve adhesion and assist in stabilizing their locations until pressing is performed. If this is done, the minimum distance across each sphere should not be less that the finished green sheet thickness (e.g. the nominal thickness less shrinkage and compressibility). However, as a practical matter, the diameter of the spheres may be dictated by the feature size of the conductive pattern and the thickness of the green sheet reduced accordingly. This constraint does not pose a significant problem in handling of the green sheets since, by virtue of the invention, no predrilling of via holes is required. While this process requires separate writing and development steps for the vias and, subsequently, for the conductive patterns, no additional tooling is required and similar or the same developing arrangements can be used. The same apparatus can be used for writing in either case.

Alternatively, a pattern may be written on a separate rigid substrate and that pattern may be subsequently processed to deposit the particles or metal spheres onto this substrate. The substrate can then be aligned with a green sheet and the pattern transferred or the spheres pressed into the green sheet.

The green sheet in this case would preferably include a thermoplastic polymer binder that can be heated to soften the green sheet, if necessary, in order to facilitate embedding of the spheres into the green sheet during the pressing operation. Additionally, the green sheet typically has some void volume associated with the manufacturing process of the green sheet, itself, that facilitates the penetration of the spheres into the green sheet.

Figure 6:
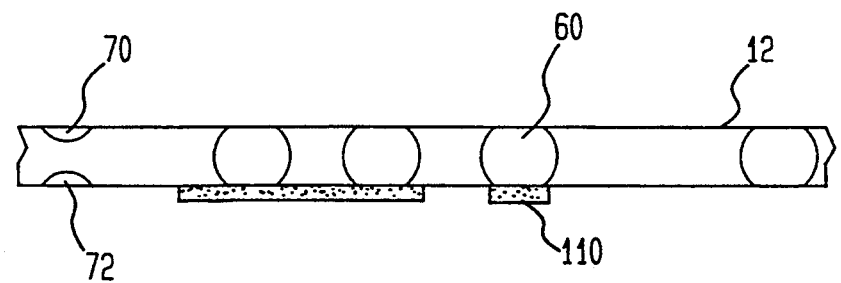
FIG. 6 illustrates a cross-section of a substrate completed in accordance with the invention.

FIG. 6 shows a completed green sheet 12 in accordance with the invention, including vias formed by selectively embedded spheres 60 which are selectively connected by selectively written and developed patterns 110. When a plurality of these lamina are to be assembled and laminated into a multi-layer structure, the direct electrostatic writing technique in accordance with the invention can be advantageously used to form oppositely charged areas such as are shown at 70 and 72 to assist in maintaining accurate registration of each lamina with a contiguous lamina while lamination is carried out.

In view of the foregoing, it is seen that the invention allows the direct writing of both conductor and via patterns at high resolution and small minimum feature size. High accuracy via patterns can also be formed at improved manufacturing yield and reduced cost and maintenance of registration of the plurality of lamina is simplified. The invention also allows the economical utilization of MLM and MLC technology to the construction of custom modules. High resolution patterns as described above generally require development in a liquid. However, lower resolution patterns can be developed with dry powder development.

Additionally, it should be noted that the invention is not limited to only the formation of conductive patterns. The above-described direct writing technique can also be used with non-conductive particulate materials in order to form insulating layers over conductors and overlapping portions of the substrate. This aspect of the invention also permits the formation of other microstructures, such as capacitors and multiple layer conductor patterns on a single layer within a MLM device by a plurality of sequential direct writing and pattern development operations.

While the invention has been described in terms of a single preferred embodiment, those skilled in the art will recognize that the invention can be practiced with modification within the spirit and scope of the appended claims.

We claim:

1. A method of applying electrically conductive material to a surface of a dielectric material green sheet comprising ceramic materials in a polymeric binder including the steps of directly writing an electrostatic pattern on said surface by placing electrical charge on said surface of said dielectric material, applying a liquid suspension of a particulate electrically conductive material to said surface, adhering said particulate electrically conductive material to said electrostatic pattern on said surface, and forming an electrically conductive deposit of said adhered particulate electrically conductive material.

2. A method as recited in claim 1, wherein said particulate conductive material comprises conductive bodies having a substantially spherical shape.

3. A method as recited in claim 2, wherein said conductive bodies include flattened areas on the surface thereof.

4. A method as recited in claim 1, wherein said particulate material is a powder dispersion having a particle size in the range of 0.5 to 2.5 microns.

5. A method as recited in claim 1, wherein said particulate conductive material includes at least one of copper, molybdenum, tungsten, gold, silver and alloys thereof.

6. A method as recited in claim 1, including the further step of applying a binder to said particulate material.

7. A method as recited in claim 6, wherein said binder material is hydrocarbon or acrylic based.

8. A method as recited in claim 1, including the further step of applying a charge control agent to said particulate material.

9. A method as recited in claim 8, wherein said charge control agent includes at least one of a napthanate, octoate, stearate and sulfonate compound.

10. A method as recited in claim 1, wherein said step of applying said particulate material includes the further step of immersing said surface in said liquid suspension.

11. A method as recited in claim 10, including the further step of applying a binder to said particulate material.

12. A method as recited in claim 11, wherein said binder material is hydrocarbon or acrylic based.

13. A method as recited in claim 10, including the further step of applying a charge control agent to said particulate material.

14. A method as recited in claim 13, wherein said charge control agent includes at least one of a napthanate, octoate, stearate and sulfonate compound.

15. A method as recited in claim 1 wherein said step of directly writing an electrostatic pattern on said surface includes the further steps of charging a region of said surface and selectively discharging selected areas within said region.

16. A method as recited in claim 1, wherein said step of forming an electrically conductive deposit includes a step of at least one of pressing, laminating and fusing of said particulate electrically conductive material.

* * * * *